(12) United States Patent
Ju et al.

(10) Patent No.: US 9,239,518 B2
(45) Date of Patent: Jan. 19, 2016

(54) PHOTOSENSITIVE RESIN COMPOSITION AND METHOD OF FORMING PATTERN USING THE SAME

(71) Applicant: Samsung Display Co., Ltd., Yongin, Gyeonggi-Do (KR)

(72) Inventors: Jin Ho Ju, Seoul (KR); Seung Bo Shim, Asan-si (KR); Jun Gi Kim, Seoul (KR); Yang-Ho Jung, Seoul (KR); Hyang-Shik Kong, Seongnam-si (KR); Byung-Uk Kim, Hwaseong-si (KR); Jin-Sun Kim, Hwaseong-si (KR); Tae-Hoon Yeo, Hwaseong-si (KR); Hyoc-Min Youn, Hwaseong-si (KR); Sang-Hoon Lee, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/161,939

(22) Filed: Jan. 23, 2014

(65) Prior Publication Data

US 2014/0234776 A1 Aug. 21, 2014

(30) Foreign Application Priority Data

Feb. 15, 2013 (KR) .................. 10-2013-0016479

(51) Int. Cl.
| | |
|---|---|
| G03F 7/023 | (2006.01) |
| G03F 7/38 | (2006.01) |
| G03F 7/075 | (2006.01) |
| G03F 7/004 | (2006.01) |
| G03F 7/022 | (2006.01) |
| G03F 7/32 | (2006.01) |

(52) U.S. Cl.
CPC ............ *G03F 7/0233* (2013.01); *G03F 7/0048* (2013.01); *G03F 7/022* (2013.01); *G03F 7/0751* (2013.01); *G03F 7/0755* (2013.01); *G03F 7/38* (2013.01); *G03F 7/322* (2013.01)

(58) Field of Classification Search
CPC ....... G03F 7/0226; G03F 7/0233; G03F 7/38; G03F 7/0751; G03F 7/0048
USPC .................. 430/191, 192, 193, 165, 326, 330
See application file for complete search history.

(56) References Cited

U.S. PATENT DOCUMENTS

| | | | | |
|---|---|---|---|---|
| 5,378,586 | A * | 1/1995 | Uetani et al. ............... | 430/192 |
| 5,395,728 | A * | 3/1995 | Jacovich et al. ............ | 430/192 |
| 5,407,779 | A * | 4/1995 | Uetani et al. ............... | 430/192 |
| 5,541,033 | A * | 7/1996 | Blakeney et al. ........... | 430/192 |
| 5,609,982 | A * | 3/1997 | Sato et al. .................. | 430/192 |
| 5,747,218 | A * | 5/1998 | Momota et al. ............ | 430/192 |
| 5,750,310 | A * | 5/1998 | Sato et al. .................. | 430/192 |
| 6,030,746 | A | 2/2000 | Nagata et al. | |
| 6,686,120 | B2 * | 2/2004 | Lee et al. ................... | 430/191 |
| 7,534,547 | B2 | 5/2009 | Hanabata et al. | |
| 8,278,021 | B2 * | 10/2012 | Kang et al. ................. | 430/270.1 |
| 2003/0134222 | A1 * | 7/2003 | Lee et al. ................... | 430/191 |
| 2011/0111346 | A1 | 5/2011 | Jeong et al. | |
| 2011/0171578 | A1 | 7/2011 | Cho et al. | |
| 2012/0171609 | A1 | 7/2012 | Jeong et al. | |
| 2012/0171610 | A1 | 7/2012 | Lee et al. | |
| 2012/0171614 | A1 | 7/2012 | Cha et al. | |

FOREIGN PATENT DOCUMENTS

| | | |
|---|---|---|
| JP | 09-188642 A | 7/1997 |
| JP | 2003-021839 A | 1/2003 |
| KR | 1020030060435 A | 7/2003 |
| KR | 1020070064365 A | 6/2007 |
| KR | 1020100109792 A | 10/2010 |
| KR | 101015859 B1 | 2/2011 |
| KR | 1020110054465 A | 5/2011 |
| KR | 1020120036330 A | 4/2012 |
| KR | 1020120056938 A | 6/2012 |
| KR | 1020120074616 A | 7/2012 |

\* cited by examiner

*Primary Examiner* — John S Chu
(74) *Attorney, Agent, or Firm* — Cantor Colburn LLP

(57) ABSTRACT

A photosensitive resin composition includes: an acrylic copolymer comprising a polymerization product of a first monomer comprising at least one selected from an unsaturated carboxylic acid and an unsaturated carboxylic acid anhydride, and a second monomer comprising an olefin-based unsaturated compound; a photosensitive component comprising at least one 1,2-quinonediazide-5-sulfonic acid ester compound selected from compounds represented by Chemical Formulae 1 to 4; a coupling agent; and a solvent, wherein a total amount of asymmetric compounds in the photosensitive component is greater than or equal to 45 area percent as determined by high performance liquid chromatography:

Chemical Formula 1

Chemical Formula 2
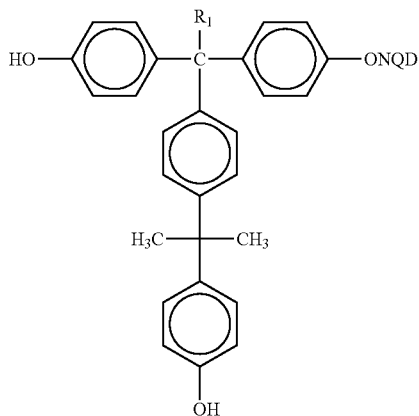
Chemical Formula 4
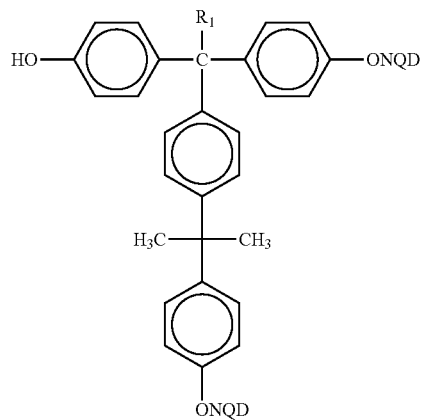
Chemical Formula 3
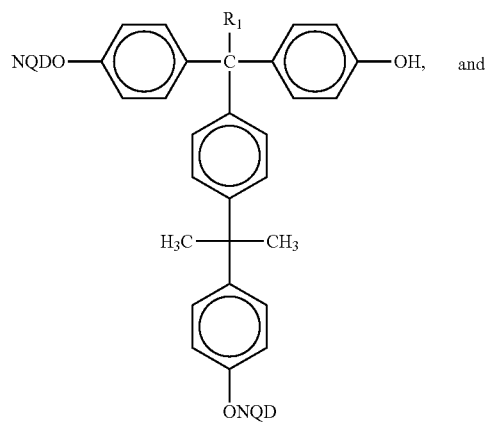
and
wherein $R_1$ is a hydroxyl group or a methyl group, and NQD is a 1,2-quinonediazide 5-sulfonyl group.
20 Claims, 2 Drawing Sheets

PHOTOSENSITIVE RESIN COMPOSITION AND METHOD OF FORMING PATTERN USING THE SAME

This application claims priority to Korean Patent Application No. 10-2013-0016479, filed on Feb. 15, 2013, and all the benefits accruing therefrom under 35 U.S.C. §119, the content of which in its entirety is herein incorporated by reference.

BACKGROUND (a) Field

The present application relates to a photosensitive resin composition and a pattern forming method using the same.

(b) Description of the Related Art

In general, a flat panel display, which is widely used presently, includes various types, for example, a liquid crystal display ("LCD") and an organic light emitting diode ("OLED") display.

In a process of forming the flat panel display, a photoresist material may be used for patterning a film via a photoprocess. Also, the photoresist material may be directly formed into the film through exposure and developing.

An insulating layer, a column spacer, an overcoat layer, and a color filter layer may be formed by using the photoresist material as well. Resolution, adherence, and remainder rate may be influenced according to components of a photosensitive resin composition used to form the photoresist material.

SUMMARY

The present disclosure provides a photosensitive resin composition having excellent sensitivity, transmittance, and chemical resistance.

Also, the present disclosure provides an improved pattern forming method having excellent adherence and process margin in a high temperature and high moisture environment without a reddish defect when forming an organic layer of a display device.

An exemplary embodiment of a photosensitive resin composition includes: an acrylic copolymer containing a polymerization product of a first monomer including at least one selected from an unsaturated carboxylic acid, an unsaturated carboxylic acid anhydride and a second monomer comprising an olefin-based unsaturated compound; a photosensitive component including at least one 1,2-quinonediazide-5-sulfonic acid ester compound selected from compounds represented by Chemical Formulae 1 to 4; a coupling agent; and a solvent, wherein a total amount of asymmetric compounds in the photosensitive component is greater than or equal to 45 area percent as determined by high performance liquid chromatography.

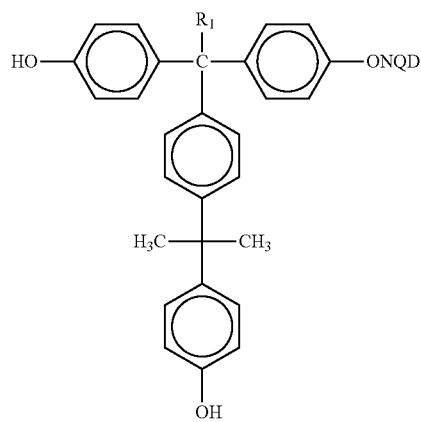

Chemical Formula 2

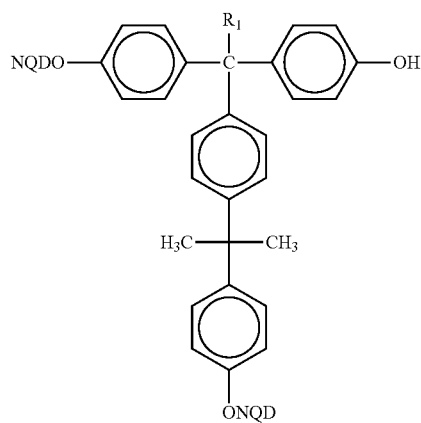

Chemical Formula 3

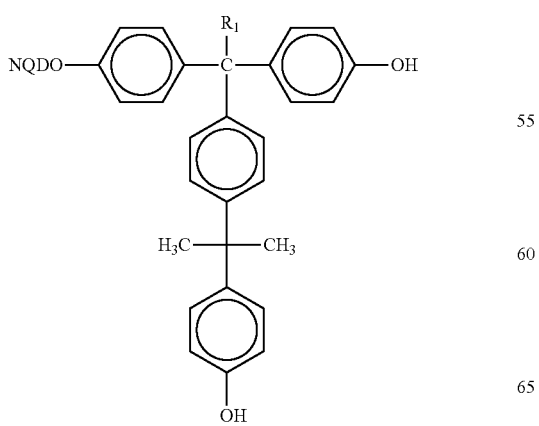

Chemical Formula 1

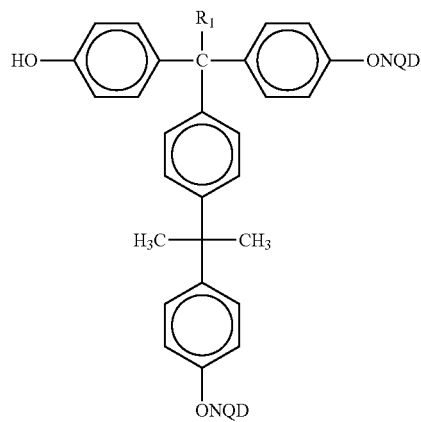

Chemical Formula 4

Here, Chemical Formulae 1 to 4 are asymmetric structures having 4,4'-[1-[4-[1-[4-hydroxyphenyl]-1-methylethyl]phenyl]ethylidene]bisphenol as a host material of a phenol compound. In chemical Formulae 1 to 4, $R_1$ is a hydroxyl group or a methyl group, and NQD is a 1,2-quinonediazide 5-sulfonyl group.

The photosensitive component may further include at least one compound selected from compounds represented by Chemical Formulae 5 to 7.

Chemical Formula 5

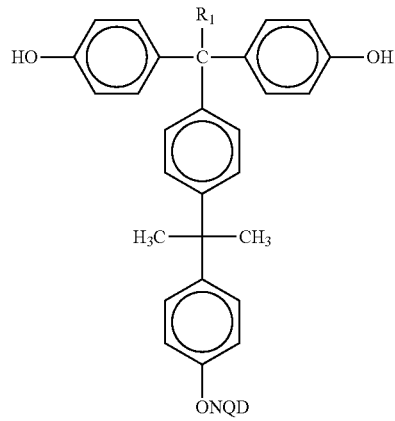

Chemical Formula 6

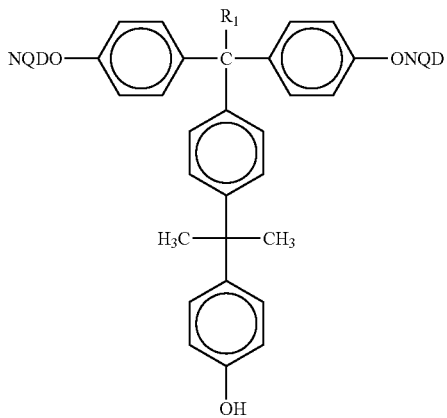

Chemical Formula 7

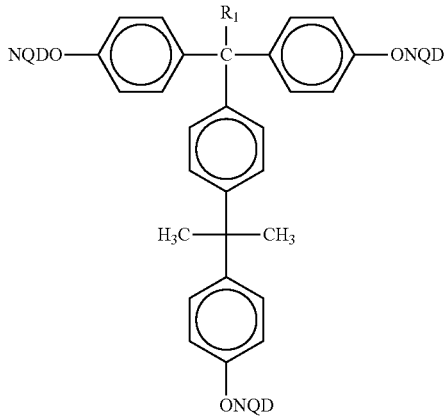

Chemical Formulae 5 to 7 are symmetry structures using 4,4'-[1-[4-[1-[4-hydroxyphenyl]-1-methylethyl]phenyl]ethylidene]bisphenol as the host material of the phenol compound. In Chemical Formulae 5 to 7, $R_1$ is a hydroxyl group or a methyl group, NQD is a 1,2-quinonediazide 5-sulfonyl group.

The coupling agent may include a silane coupling agent.

The acrylic copolymer may be present in an amount of about 100 parts by weight, the photosensitive component may be present in an amount of about 5 parts by weight to about 50 parts by weight, based on 100 parts by weight of the acrylic copolymer, and the silane coupling agent may be present in an amount of about 0.1 parts by weight to about 30 parts by weight, based on 100 parts by weight of the acrylic copolymer.

The acrylic copolymer includes a polymerization product of about 5 parts by weight to about 40 part of weight of the first monomer and about 60 parts by weight to about 95 parts by weight of the second monomer, each based on a total part by weight of the first monomer and the second monomer.

The solvent may include a first solvent having a boiling point of about 110° C. to about 150° C. and an evaporation speed of about 0.3 to about 1.0 relative to normal butyl acetate.

The first solvent may be present in an amount of more than 50 weight percent (%), based on the total weight of the solvent.

The unsaturated carboxylic acid and the unsaturated carboxylic acid anhydride may include at least one selected from acrylic acid, methacrylic acid, maleic acid, fumaric acid, citraconic acid, metaconic acid, itaconic acid, and anhydrides thereof.

The olefin-based unsaturated compound may include at least one selected from methylmethacrylate, ethylmethacrylate, n-butyl methacrylate, sec-butyl methacrylate, tert-butyl methacrylate, methylacrylate, isopropyl acrylate, cyclohexyl methacrylate, 2-methylcyclo hexylmethacrylate, dicyclopentenylacrylate, dicyclopentanylacrylate, dicyclopentenylmethacrylate, dicyclopentanylmethacrylate, 1-adamantyl acrylate, 1-adamantyl methacrylate, dicyclopentanyloxyethylmethacrylate, isoboronylmethacrylate, cyclohexylacrylate, 2-methylcyclohexylacrylate, dicyclopentanyloxyethylacrylate, isoboronylacrylate, penylmethacrylate, penylacrylate, benzylacrylate, 2-hydroxyethylmethacrylate, styrene, σ-methyl styrene, m-methyl styrene, p-methyl styrene, vinyltoluene, p-methoxy styrene, 1,3-butadiene, isoprene, 2,3-dimethyl 1,3-butadiene, acrylic acid glycidyl ester, methacrylic acid glycidyl ester, α-ethylacrylic acid glycidyl ester, α-n-propylacrylic acid glycidyl ester, α-n-butylacrylic acid glycidyl ester, acrylic acid-β-methylglycidyl ester, methacrylic acid-β-methylglycidyl ester, acrylic acid-β-ethylglycidyl ester, methacrylic acid-β-ethylglycidyl ester, acrylic acid-3,4-epoxybutyl ester, methacrylic acid-3,4-epoxybutyl ester, acrylic acid-6,7-epoxyheptyl ester, methacrylic acid-6,7-epoxyheptyl ester, α-ethylacrylic acid-6,7-epoxyheptyl ester, o-vinylbenzylglycidylether, m-vinylbenzylglycidylether, p-vinylbenzylglycidylether, and methacrylic acid 3,4-epoxy cyclohexyl ester.

The acrylic copolymer may have a polystyrene exchange weight average molecular weight of about 3000 Daltons to about 30,000 Daltons.

The coupling agent may include at least one selected from (3-glycide oxypropyl)trimethoxysilane, (3-glycide oxypropyl)triethoxysilane, (3-glycide oxypropyl)methyldimethoxysilane, (3-glycide oxypropyl)methyldiethoxysilane, (3-glycide oxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysily-N-(1,3- dimethyl-butylidene)propylamine, N-2(aminoethyl)-3-aminopropyltrimethoxysilane, N-2(aminoethyl)-3-aminopropyltriethoxysilane, N-2(aminoethyl)-3-aminopropylmethyldimethoxysilane, N-phenyl-3-aminopropyltrimethoxysilane, and (3-isocynateprophyl)triethoxysilane.

A pattern forming method according to an exemplary embodiment of the present disclosure includes disposing a photosensitive resin composition on a substrate, exposing the photosensitive resin composition, and developing the photosensitive resin composition, wherein the photosensitive resin composition includes: an acrylic copolymer comprising a polymerization product of a first monomer comprising at least one selected from an unsaturated carboxylic acid and an unsaturated carboxylic acid anhydride and a second monomer comprising an olefin-based unsaturated compound; a photosensitive component including at least one 1,2-quinonediazide-5-sulfonic acid ester compound selected from compounds represented by Chemical Formulae 1 to 4; a coupling agent; and a solvent, wherein a total amount of asymmetric compounds in the photosensitive component is greater than or equal to 45 area percent as determined by high performance liquid chromatography.

Chemical Formula 1

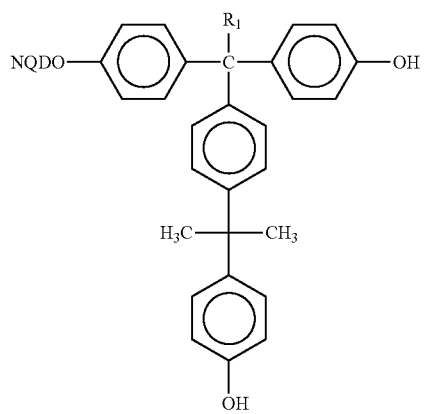

Chemical Formula 2

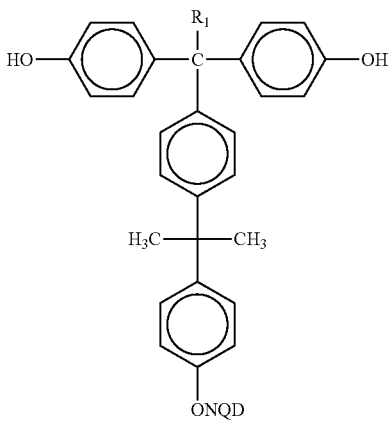

Chemical Formula 3

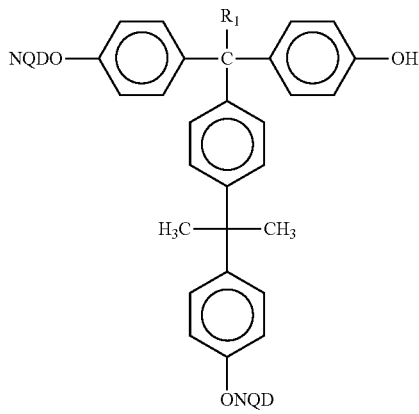

Chemical Formula 4

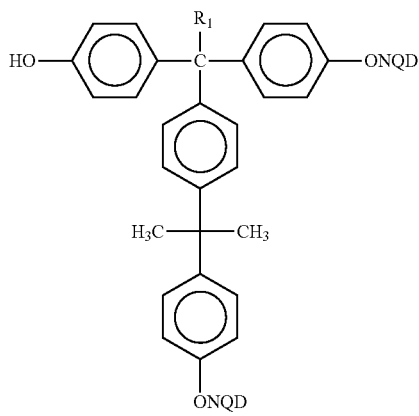

Chemical Formulae 1 to 4 are asymmetric structures using 4,4'-[1-[4-[1-[4-hydroxyphenyl]-1-methylethyl]phenyl]ethylidene]bisphenol as a host material of a phenol compound, $R_1$ is a hydroxyl group or a methyl group, and NQD is a 1,2-quinonediazide 5-sulfonyl group.

The photosensitive component may further include at least one compound selected from compounds represented by Chemical Formulae 5 to 7.

Chemical Formula 5

Chemical Formula 6

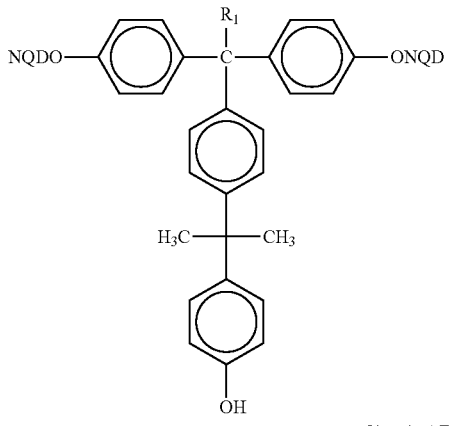

Chemical Formula 7

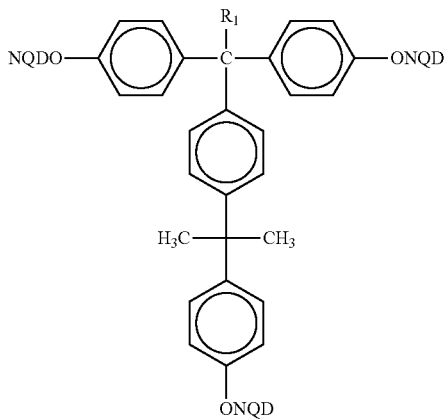

Chemical Formulae 5 to 7 are symmetric structures using 4,4'-[1-[4-[1-[4-hydroxyphenyl]-1-methylethyl]phenyl]ethylidene]bisphenol as the host material of the phenol compound, $R_1$ is a hydroxyl group or a methyl group, and NQD is a 1,2-quinonediazide 5-sulfonyl.

The coupling agent may include a silane coupling agent.

The acrylic copolymer may be present in an amount of about 100 parts by weight, the photosensitive component may be present in an amount of about 5 parts by weight to about 50 parts by weight, based on 100 parts by weight of the acrylic copolymer, and the silane coupling agent may be present in an amount of about 0.1 parts by weight to about 30 parts by weight, based on 100 parts by weight of the acrylic copolymer.

The acrylic copolymer is obtained by copolymerizing about 5 parts by weight to about 40 part of weight of the first monomer and about 60 parts by weight to about 95 parts by weight of the second monomer, each based on a total part by weight of the first monomer and the second monomer.

The solvent may include a first solvent having a boiling point of about 110° C. to about 150° C. and an evaporation speed of about 0.3 to about 1.0 relative to normal butyl acetate.

The coupling agent may include at least one selected from (3-glycide oxypropyl)trimethoxysilane, (3-glycide oxypropyl)triethoxysilane, (3-glycide oxypropyl)methyldimethoxysilane, (3-glycide oxypropyl)methyldiethoxysilane, (3-glycide oxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysily-N-(1,3-dimethyl-butylidene)propylamine, N-2(aminoethyl)-3-aminopropyltrimethoxysilane, N-2(aminoethyl)-3-aminopropyltriethoxysilane, N-2(aminoethyl)-3-aminopropylmethyldimethoxysilane, N-phenyl-3-aminopropyltrimethoxysilane, and (3-isocynateprophyl)triethoxysilane.

The pattern forming method may further include prebaking the photosensitive resin composition at a temperature of about 100 degrees Celsius to about 120 degrees Celsius before the exposure and the developing.

A developer including an alkali solution may be used in the developing.

According to an exemplary embodiment of the present disclosure, the photosensitive resin composition may form an organic layer with excellent sensitivity, transmittance, and chemical resistance while preventing a reddish defect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
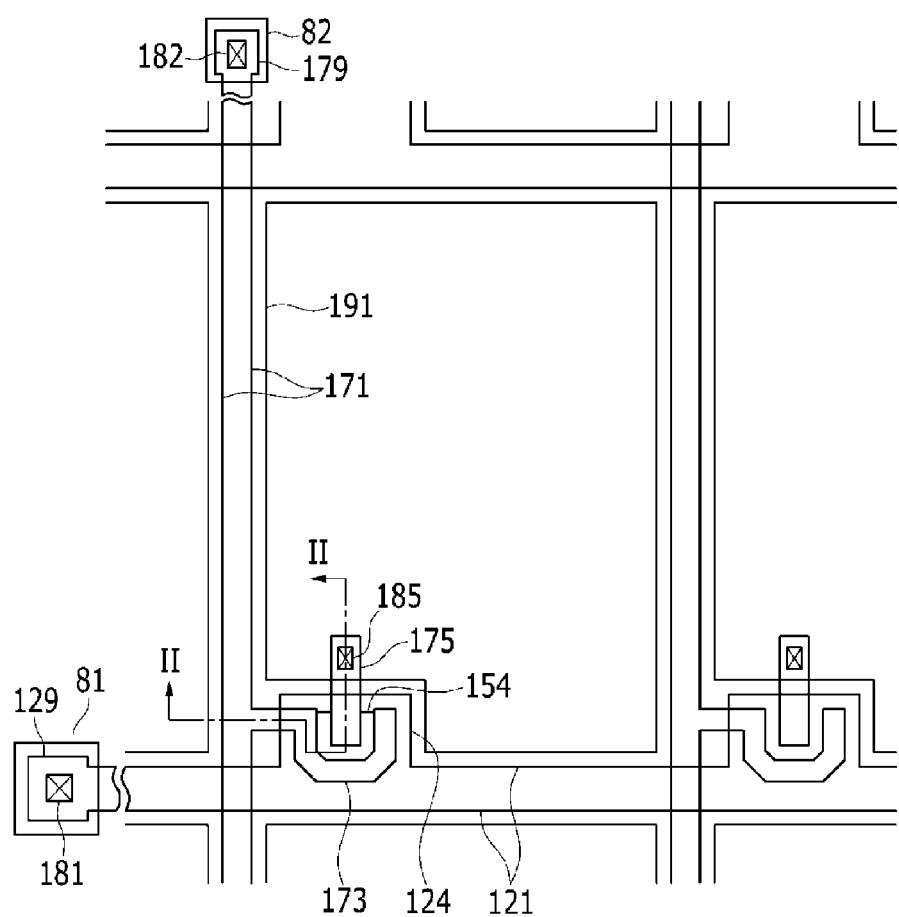
FIG. 1 is a top plan view of an exemplary embodiment of a display device.

Exemplary embodiments of the present disclosure will be described in detail with reference to the accompanying drawings. However, the present disclosure is not limited to exemplary embodiments described herein, but may be embodied in other forms. Rather, exemplary embodiments described herein are provided to thoroughly and completely explain the disclosed contents and to sufficiently transfer the ideas of the present invention to a person of ordinary skill in the art.

In drawings, the thicknesses of layers and regions are exaggerated for clarity. It is to be noted that when a layer is referred to as being "on" another layer or substrate, it can be directly formed on another layer or substrate or can be formed on the other layer or substrate with a third layer interposed therebetween. Like constituent elements are denoted by like reference numerals throughout the specification.

It will be understood that, although the terms first, second, third etc. may be used herein to describe various elements, components, regions, layers and/or sections, there elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a", "an" and "the" are intended to include the plural forms as well, unless the context clearly indicates otherwise. The term "or" means "and/or." As used herein, the term "and/or" includes any and all combinations of one or more of the associated listed items.

Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may typically have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A photosensitive resin composition according to an exemplary embodiment of the present disclosure includes: an acrylic copolymer comprising a polymerization product of a first monomer comprising at least one selected from an unsaturated carboxylic acid and an unsaturated carboxylic acid anhydride and a second monomer comprising an olefin-based unsaturated compound; a photosensitive component including at least one 1,2-quinonediazide-5-sulfonic acid ester compound selected from compounds represented by Chemical Formulae 1 to 4; a coupling agent; and a solvent, wherein a total amount of asymmetric compounds in the photosensitive component is greater than or equal to 45 area percent as determined by high performance liquid chromatography.

Chemical Formula 1

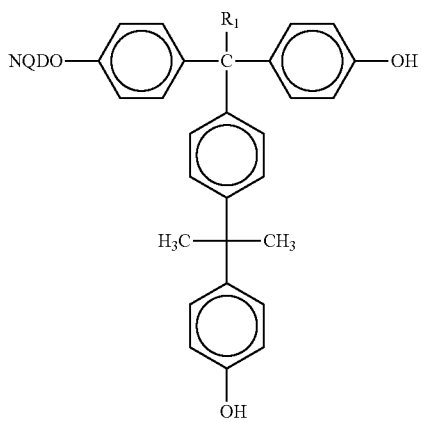

Chemical Formula 2

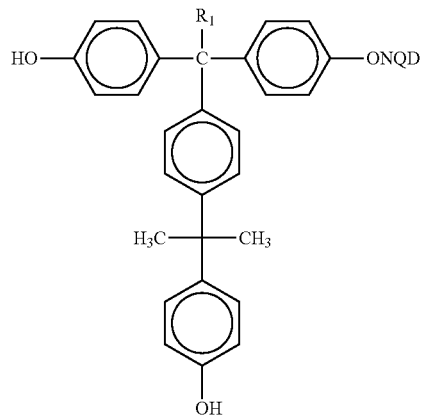

Chemical Formula 3

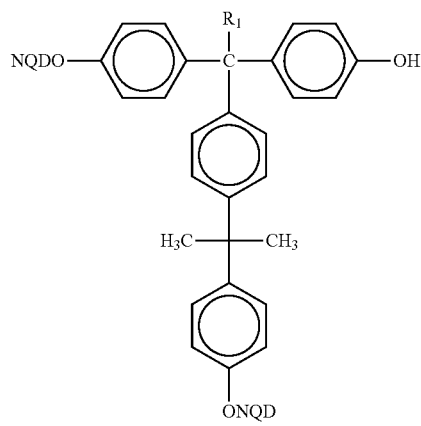

Chemical Formula 4

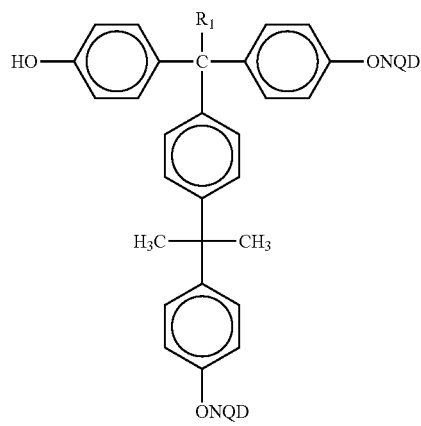

Here, Chemical Formulae 1 to 4 are asymmetric structures including 4,4'-[1-[4-[1-[4-hydroxyphenyl]-1-methylethyl]phenyl]ethylidene]bisphenol as a host material of a phenol compound, and $R_1$ is a hydroxyl group or a methyl group, while NQD is a 1,2-quinonediazide 5-sulfonyl group.

In the present exemplary embodiment, area percent means individual peak areas as a percentage of the total area of all the peaks, wherein the peak areas are determined by high performance liquid chromatography ("HPLC"). In one embodiment, the photosensitive component includes at least 45 area percent of at least one 1,2-quinonediazide-5-sulfonic acid ester compound selected from compounds represented by Chemical Formulae 1 to 4.

In the present exemplary embodiment, the photosensitive component may further include at least one compound selected from compounds represented by Chemical Formulae 5 to 7.

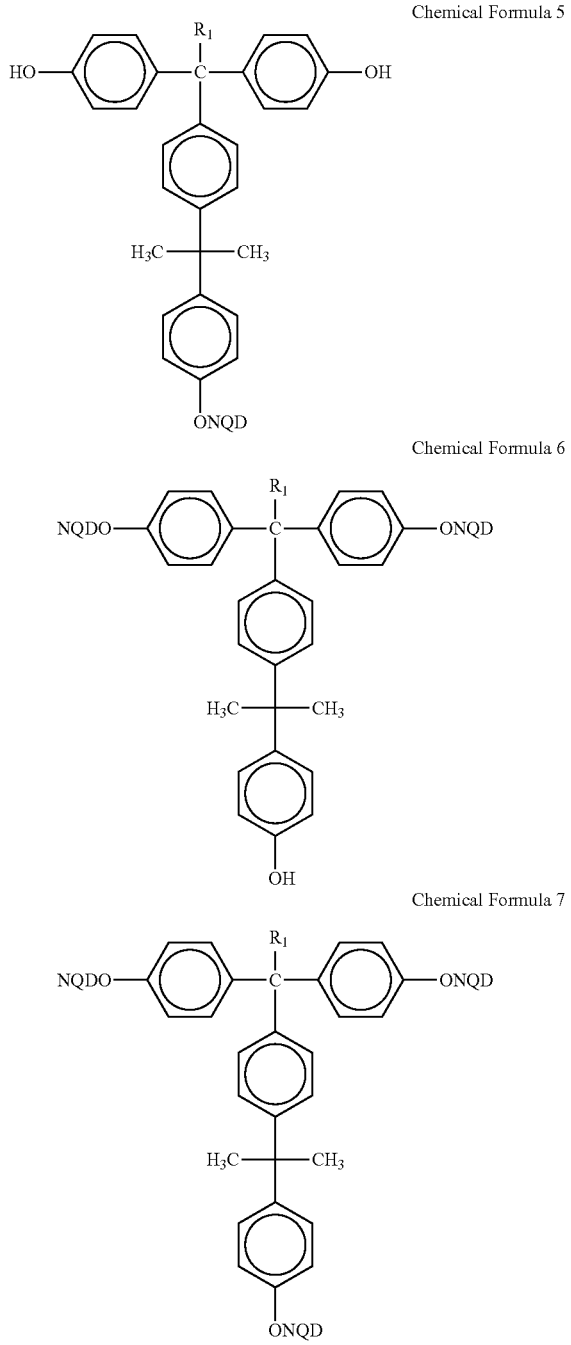

Here, Chemical Formulae 5 to 7 are symmetrical structures including 4,4'-[1-[4-[1-[4-hydroxyphenyl]-1-methylethyl]phenyl]ethylidene]bisphenol as a host material of the phenol compound, and $R_1$ is the hydroxyl group or the methyl group, while NQD is a 1,2-quinonediazide 5-sulfonyl group.

In the present exemplary embodiment, the acrylic copolymer is an alkali-soluble resin that is formed by copolymerizing a first monomer comprising at least one selected from an unsaturated carboxylic acid and unsaturated carboxylic acid anhydride, and a second monomer comprising an olefin-based unsaturated compound. Also, the acrylic copolymer may be obtained by removing a non-reacted monomer through precipitation and filtering, and a vacuum drying process after copolymerizing the first monomer and the second monomer through a radical reaction under the presence of a solvent and a polymerization initiator.

In the present exemplary embodiment, the unsaturated carboxylic acid and the unsaturated carboxylic acid anhydride may include at least one selected from acrylic acid, methacrylic acid, maleic acid, fumaric acid, citraconic acid, metaconic acid, itaconic acid, and anhydrides thereof. Here, use of the acrylic acid, methacrylic acid, or anhydride of maleic acid may be further preferable for the copolymerization reactivity and solubility in an alkali aqueous solution.

The first monomer may be included at about 5 parts by weight to about 40 parts by weight, based on a total part by weight of the first monomer and the second monomer. When the content is less than 5 parts by weight, it is difficult to dissolve the copolymer in the alkali aqueous solution, and when the content is more than 40 parts by weight, the solubility of the copolymer in the alkali aqueous solution is excessively increased.

In the present exemplary embodiment, the vinyl compound may include at least one selected from methylmethacrylate, ethylmethacrylate, n-butyl methacrylate, sec-butyl methacrylate, tert-butyl methacrylate, methylacrylate, isopropyl acrylate, cyclohexyl methacrylate, 2-methylcyclo hexyl-methacrylate, dicyclopentenylacrylate, dicyclopentanylacrylate, dicyclopentenylmethacrylate, dicyclopentanylmethacrylate, 1-adamantyl acrylate, 1-adamantyl methacrylate, dicyclopentanyloxyethylmethacrylate, isoboronylmethacrylate, cyclohexylacrylate, 2-methylcyclohexylacrylate, dicyclopentanyloxyethylacrylate, isoboronylacrylate, penylmethacrylate, penylacrylate, benzylacrylate, 2-hydroxyethylmethacrylate, styrene, σ-methyl styrene, m-methyl styrene, p-methyl styrene, vinyltoluene, p-methoxy styrene, 1,3-butadiene, isoprene, 2,3-dimethyl 1,3-butadiene, acrylic acid glycidyl ester, methacrylic acid glycidyl ester, α-ethylacrylic acid glycidyl ester, α-n-propylacrylic acid glycidyl ester, α-n-butylacrylic acid glycidyl ester, acrylic acid-β-methylglycidyl ester, methacrylic acid-β-methylglycidyl ester, acrylic acid-β-ethylglycidyl ester, methacrylic acid-β-ethylglycidyl ester, acrylic acid-3,4-epoxybutyl ester, methacrylic acid-3,4-epoxybutyl ester, acrylic acid-6,7-epoxyheptyl ester, methacrylic acid-6,7-epoxyheptyl ester, α-ethylacrylic acid-6,7-epoxyheptyl ester, o-vinylbenzylglycidylether, m-vinylbenzylglycidylether, p-vinylbenzylglycidylether, and methacrylic acid 3,4-epoxy-cyclohexyl ester.

Here, it is preferable that the second monomer is included at about 60 parts by weight to about 95 parts by weight, based on a total part by weight of the first monomer and the second monomer. When the content is less than 60 parts by weight, the resolution and thermal resistance are deteriorated, and when the content is more than 95 parts by weight, it is difficult for the acrylic copolymer to be dissolved in the alkali aqueous solution as a developer.

As a solvent for solution polymerization of the above monomers, methanol, tetrahydroxyfuran, toluene, dioxane, and the like may be used.

A polymerization initiator used for a solution polymerization of the above monomers may be a radical polymerization initiator, and specifically 2,2-azobisisobutyronitrile, 2,2-azobis(2,4-dimethylvaleronitrile), 2,2-azobis(4-methoxy 2,4-dimethylvaleronitrile), 1,1-azobis(cyclohexane-1-carbonitrile), and dimethyl 2,2'-azobisisobutyrate.

The acrylic copolymer obtained by removing the non-reacted monomer through the precipitation and filtering and the vacuum drying process after radically reacting the above monomers in the presence of the solvent and the polymerization initiator preferably has a polystyrene exchange weight average molecular weight ("Mw") of about 3000 Daltons to about 30,000 Daltons. In a case of an organic insulator having a weight average molecular weight (Mw, based on polystyrene) of less than 3000 Daltons, the developing ability and the remainder rate may be deteriorated, and the pattern developing and thermal resistance may be decreased, while in a case of an organic insulator having a polystyrene exchanged weight average molecular weight (Mw) of more than 30,000 Daltons, the pattern developing may be poor.

The photosensitive component of the present exemplary embodiment includes at least 45 area percent of structurally asymmetric compounds determined by HPLC (high performance liquid chromatography). Further, the photosensitive component includes at least one 1,2-quinonediazide-5-sulfonic acid ester compound selected from compounds represented by Chemical Formulae 1 to 4, which may be manufactured by reacting a 1,2-quinonediazide-5-sulfonic acid halogen compound and a phenol compound in the presence of a weak base.

In addition, instead of the phenol compound represented by Chemical Formulae 1 to 4, a phenol compound expressed by Chemical Formulae 8 to 25 may be used.

Chemical Formula 8

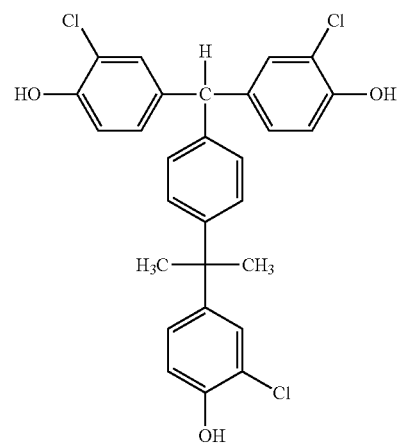

Chemical Formula 9

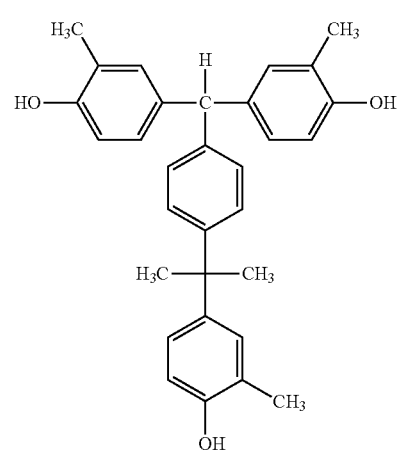

Chemical Formula 10

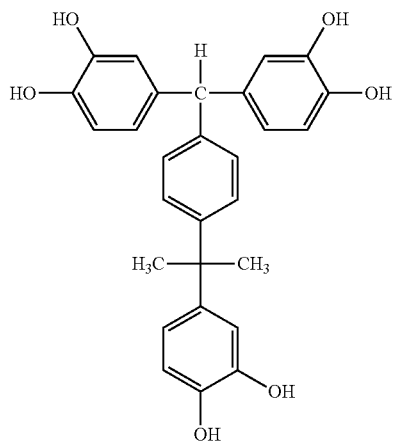

Chemical Formula 11

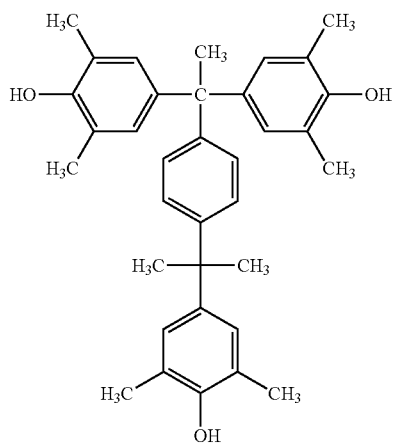

Chemical Formula 12

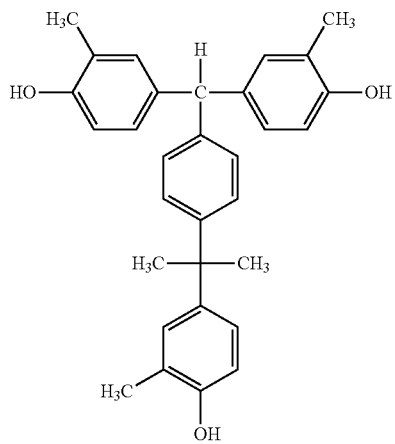

Chemical Formula 13
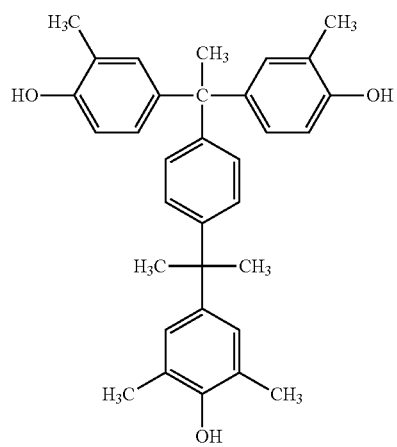
Chemical Formula 14
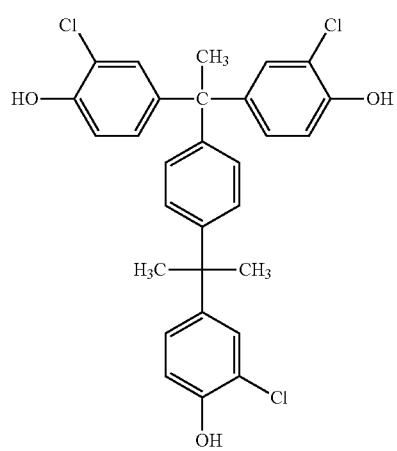
Chemical Formula 15
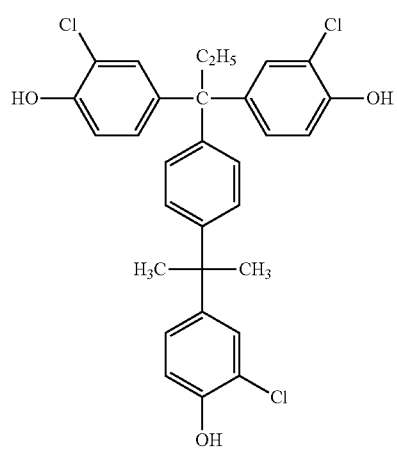
Chemical Formula 16
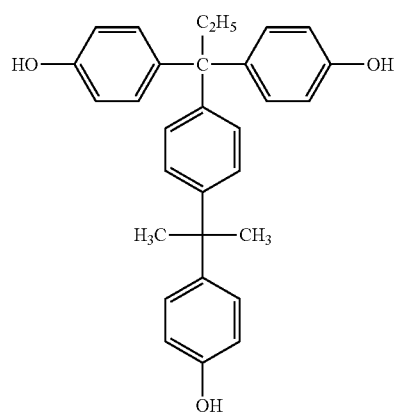
Chemical Formula 17
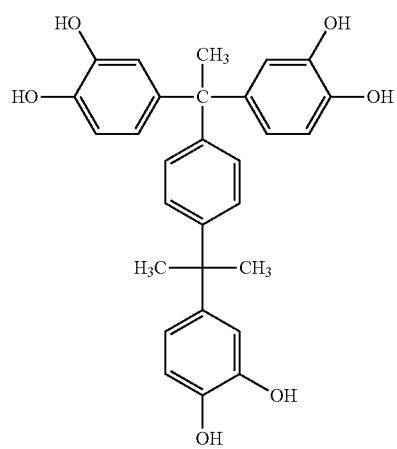
Chemical Formula 18
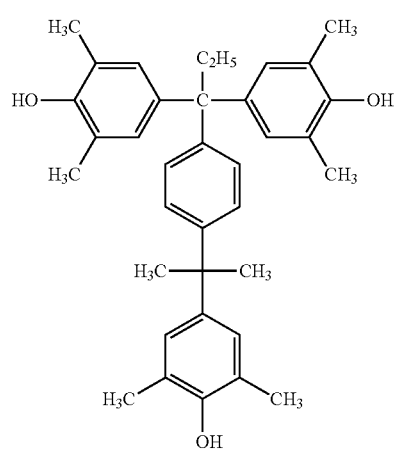

Chemical Formula 19
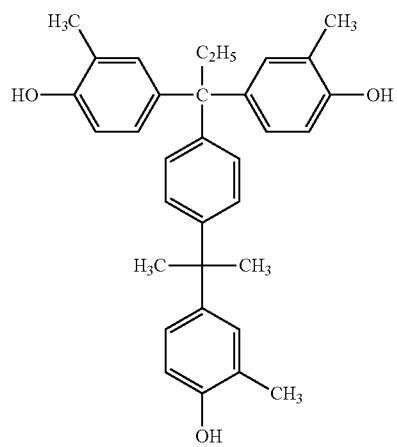
Chemical Formula 20
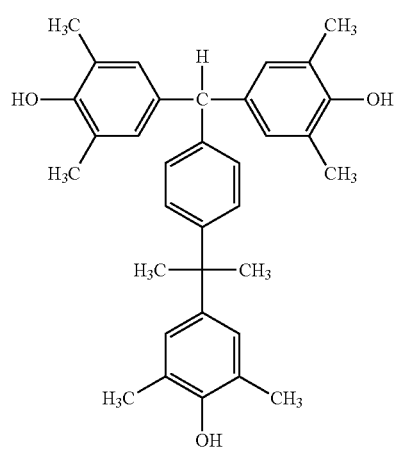
Chemical Formula 21
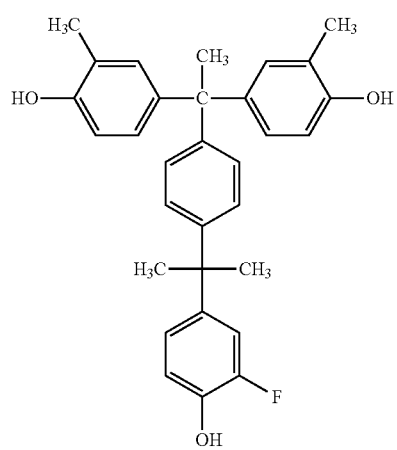
Chemical Formula 22
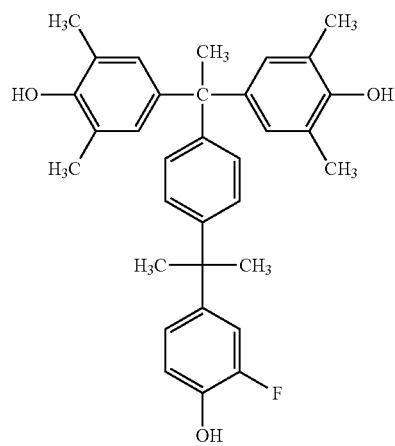
Chemical Formula 23
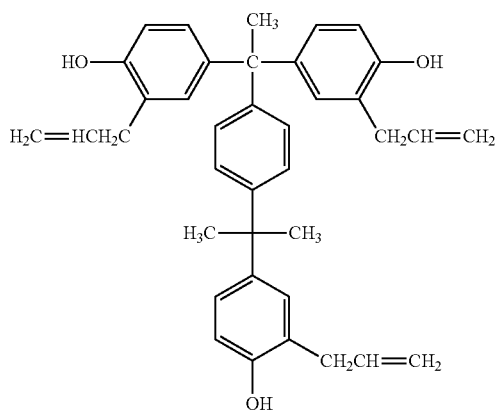
Chemical Formula 24
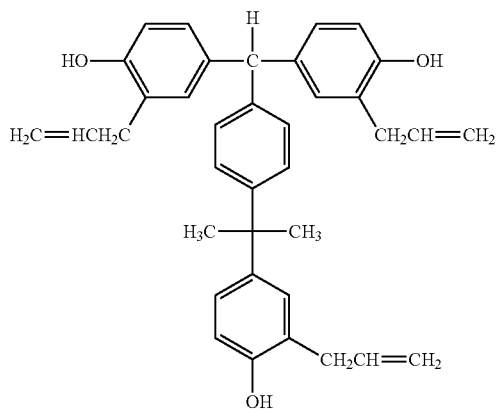

-continued

Chemical Formula 25

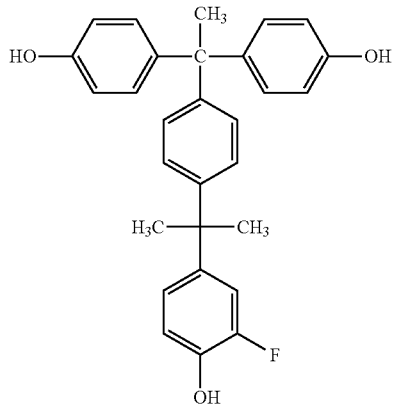

The photosensitive component may be used by mixing at least one phenol compound selected from compounds represented by Chemical Formulae 1 to 4 and at least one phenol compound selected from compounds represented by Chemical Formulae 8 to 25.

The content of the photosensitive component is in a range of about 5 parts by weight to about 50 parts by weight, based on 100 parts by weight of the acrylic copolymer. When the content is less than 5 parts by weight, a solubility difference between an exposed portion and a non-exposed portion is small such that the pattern formation is difficult, and when the content is over 50 parts by weight, a large amount of the non-reacted 1,2-quinonediazide-5-sulfonic acid ester compound remains when irradiating light for a short time such that the solubility of the alkali aqueous solution as the developer is seriously decreased and then the developing is difficult.

In the present exemplary embodiment, the coupling agent is used to improve the adherence with the lower substrate or the insulating layer and a silane coupling agent. Here, the silane coupling agent may include at least one selected from (3-glycide oxypropyl)trimethoxysilane, (3-glycide oxypropyl)triethoxysilane, (3-glycide oxypropyl) methyl dimethoxysilane, (3-glycide oxypropyl)methyldiethoxysilane, (3-glycide oxypropyl)dimethylethoxysilane, 3,4-epoxybutyltrimethoxy, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysily-N-(1,3-dimethyl-butylidene)propylamine, N-2(aminoethyl)-3-aminopropyltrimethoxysilane, N-2(aminoethyl)-3-aminopropyltriethoxysilane, N-2(aminoethyl)-3-aminopropylmethyldimethoxysilane, N-phenyl-3-aminopropyltrimethoxy, and (3-isocynateprophyl)triethoxysilane.

In the present exemplary embodiment, the content of the silane coupling agent is preferably in a range of about 0.1 parts by weight to about 30 parts by weight per 100 parts by weight of the acrylic copolymer. When the content thereof is less than 0.1 parts by weight, the adherence with the lower substrate is deteriorated, and when the content thereof is more than 30 parts by weight, storage stability and developing ability are compromised and the resolution is deteriorated.

In the present exemplary embodiment, the solvent has a boiling point of about 110 degrees Celsius to about 150 degrees Celsius, and an evaporation speed of about 0.3 to about 1.0 relative to normal butyl acetate. This solvent is used to reduce a process time in a VCD ("vacuum drying") process, and the content thereof is more than 50 parts by weight for the entire solvent content. When the content of the solvent having the evaporation speed of about 0.3 to about 1.0 is less than 50 parts by weight, the VCD process time is increased.

Here, it is preferable that the solvent having the evaporation speed of about 0.3 to about 1.0 is included for a solid content of the photosensitive resin composition to be in a range of about 10 wt % to about 50 wt %. When the solid content is less than 10 wt %, the coating is thin, and the coating uniformity is deteriorated. When the solid content is more than 50 wt %, the coating is thick, and a coating equipment is overloaded when coating. When the solid content of the entire photosensitive resin composition is in a range of about 10 wt % to about 25 wt %, the photosensitive resin composition slit is easy to be used in a slit coater, in the case of about 25 wt % to about 50 wt %, the photosensitive resin composition may be easily used in a spin coater or a slit & spin coater.

The photosensitive resin composition according to an exemplary embodiment including the above components may further include a surfactant. Here, it is preferable that the surfactant of about 0.0001 parts by weight to about 2 parts by weight per 100 parts by weight of the acrylic copolymer is included, and when the content is in this range, a coating ability and the developing ability of the photosensitive resin composition may be improved.

It is preferable that the photosensitive resin composition according to the present exemplary embodiment has a solid concentration of about 10 wt % to about 50 wt % and is filtered by a millipore filter of about 0.1 to about 0.2 μm.

Next, a detail exemplary embodiment and a comparative example for the photosensitive resin composition according to an exemplary embodiment of the present disclosure will be described.

EXAMPLES

Synthesis Example 1

Preparation of Acrylic Copolymer

A mixture solution including 400 parts by weight of tetrahydrofuran, 30 parts by weight of methacrylic acid, 30 parts by weight of styrene, and 40 parts by weight of glycidylmethacrylate is added into a flask including a cooler and a stirrer. After sufficiently mixing the solution in the flask at 600 rpm, 15 parts by weight of 2,2'-azobis(2,4-dimethylvaleronitrile) is added. The temperature of the polarization mixture solution is slowly increased to 55° C., this temperature is maintained for 24 hours, and then it is cooled to room temperature, and hydrobenzophenone at 500 ppm as a polymerization inhibitor is added to obtain a polymerization solution of a solid concentration of 30 wt %. To remove the non-reacted monomer of the polymerization solution, 100 parts by weight of the polymerization solution is precipitated in 1000 parts by weight of n-hexane. After the precipitation, a solvent in which the non-reacted monomer is dissolved is removed with a filtering process using a mesh. Next, to prepare the acryl-based copolymer, the solvents including the non-reacted monomer remaining after the filtering process are completely removed through vacuum drying at a temperature of less than 30 degrees centigrade.

The weight average molecular weight of the acryl-based copolymer was 6000. The weight average molecular weight is a polystyrene exchanged average molecular weight measured by using gel permeation chromatography ("GPC").

Exemplary Embodiment 1

Manufacturing a Positive Photosensitive Resin Composition 100 parts by weight of the acrylic copolymer manufacturing by Synthesis Example 1, 25 parts by weight of the photosensitive component including 45 area percent with respect to an HPLC analysis among the compounds that are structurally asymmetric while including at least one 1,2-quinonediazide-5-sulfonic acid ester compound represented by Chemical Formulae 1 to 4, and 10 parts by weight of 3-(glycide oxypropyl)trimethoxysilane as the silane coupling agent are mixed, and propylene glycol methyletheracetate and diethylene glycol methylethyl ether of 50 wt %: 50 wt % are mixed and solved as the solvent are mixed therein to obtain 20 parts by weight of solid content, and then the photosensitive resin composition is manufactured through precipitation through a 0.1 μm millipore filter.

Chemical Formula 1

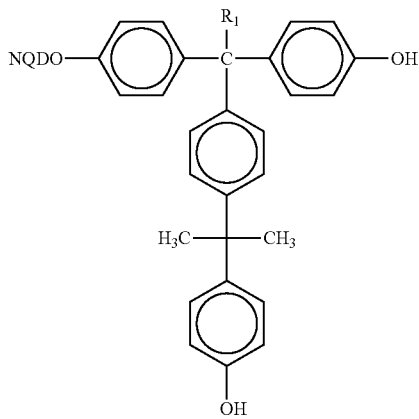

Chemical Formula 2

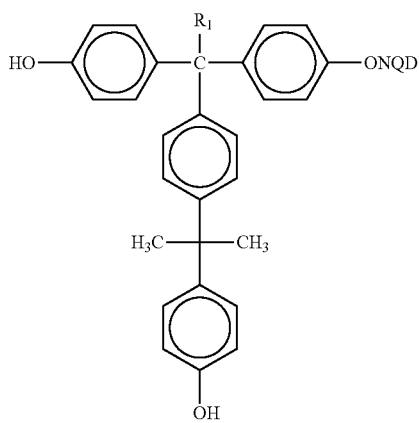

Chemical Formula 3

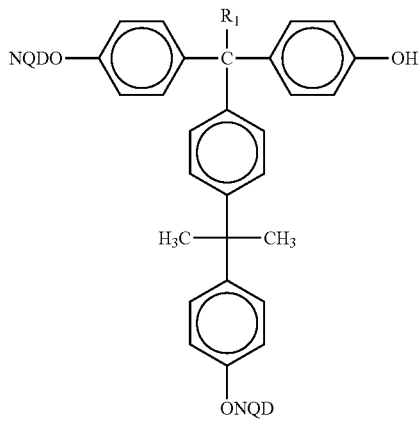

Chemical Formula 4

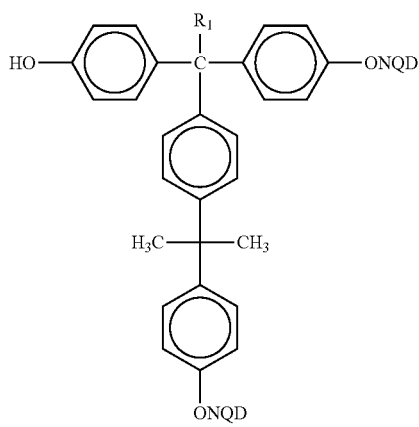

Chemical Formulae 1 to 4 are the asymmetric structure using 4,4'-[1-[4-[1-[4-hydroxyphenyl]-1-methylethyl]phenyl]ethylidene]bisphenol as the host material of the phenol compound, $R_1$ is the hydroxyl group or the methyl group, and NQD is a 1,2-quinonediazide 5-sulfonyl group.

Exemplary Embodiment 2

Manufacturing a Positive Photosensitive Resin Composition

The positive photosensitive resin composition is manufactured with the same method as Exemplary Embodiment 1, except for using the photosensitive component including 55 area percent of asymmetric compounds instead of 45 area percent of asymmetric compounds.

Exemplary Embodiment 3

Manufacturing a Positive Photosensitive Resin Composition

The positive photosensitive resin composition is manufactured with the same method as Exemplary Embodiment 1, except for using the photosensitive component including 65 area percent of asymmetric compounds instead of 45 area percent of asymmetric compounds.

Exemplary Embodiment 4

Manufacturing a Positive Photosensitive Resin Composition

The positive photosensitive resin composition is manufactured with the same method as Exemplary Embodiment 1, except for using the photosensitive component including 75 area percent of asymmetric compounds instead of 45 area percent of asymmetric compounds.

Exemplary Embodiment 5

Manufacturing a Positive Photosensitive Resin Composition

The positive photosensitive resin composition is manufactured with the same method as Exemplary Embodiment 1, except for using the photosensitive component including 85 area percent of asymmetric compounds instead of 45 area percent of asymmetric compounds.

Exemplary Embodiment 6

Manufacturing a Positive Photosensitive Resin Composition

The positive photosensitive resin composition is manufactured with the same method as Exemplary Embodiment 1, except for using 25 parts by weight of the photosensitive component including at least 50 area percent of asymmetric compounds instead of 45 area percent of asymmetric compounds.

Exemplary Embodiment 7

Manufacturing a Positive Photosensitive Resin Composition

The positive photosensitive resin composition is manufactured with the same method as Exemplary Embodiment 1, except for using 5 parts by weight of the photosensitive component instead of 25 parts by weight of the photosensitive component.

Exemplary Embodiment 8

Manufacturing a Positive Photosensitive Resin Composition

The positive photosensitive resin composition is manufactured with the same method as Exemplary Embodiment 1, except for using N-2(aminoethyl)-3-aminopropyltrimethoxysilane instead of 3-(glycide oxypropyl)trimethoxysilane as the silane coupling agent.

Exemplary Embodiment 9

Manufacturing a Positive Photosensitive Resin Composition

The positive photosensitive resin composition is manufactured with the same method as Exemplary Embodiment 1, except for using 3,4-epoxybutyltriethoxysilane instead of 3-(glycide oxypropyl)trimethoxysilane as the silane coupling agent.

Exemplary Embodiment 10

Manufacturing a Positive Photosensitive Resin Composition

The positive photosensitive resin composition is manufactured with the same method as Exemplary Embodiment 1, except for using 30 parts by weight of 3-(glycide oxypropyl)trimethoxysilane instead of 10 parts by weight of 3-(glycide oxypropyl)trimethoxysilane as the silane coupling agent.

Exemplary Embodiment 11

Manufacturing a Positive Photosensitive Resin Composition

The positive photosensitive resin composition is manufactured with the same method as Exemplary Embodiment 1, except for using 0.1 parts by weight of 3-(glycide oxypropyl)trimethoxysilane instead of 10 parts by weight of 3-(glycide oxypropyl)trimethoxysilane as the silane coupling agent.

Exemplary Embodiment 12

Manufacturing a Positive Photosensitive Resin Composition

The positive photosensitive resin composition is manufactured with the same method as Exemplary Embodiment 1, except for using 3-methoxypropionatemethyl and diethylene glycol methylethylether at 50 weight %:50 weight % as the solvent instead of propylene glycol methyletheracetate and diethylene glycol methylethylether at 50 weight %:50 weight %.

Exemplary Embodiment 13

Manufacturing a Positive Photosensitive Resin Composition

The positive photosensitive resin composition is manufactured with the same method as Exemplary Embodiment 1, except for using propylene glycol methyletheracetate and diethylene glycol methylethylether at 70 weight %:30 weight % as the solvent instead of propylene glycol methyletheracetate and diethylene glycol methylethylether at 50 weight %:50 weight %.

Comparative Example 1

Manufacturing a Positive Photosensitive Resin Composition

The positive photosensitive resin composition is manufactured with the same method as Exemplary Embodiment 1, except for using the photosensitive component including 35 area percent of asymmetric compounds instead of 45 area percent of asymmetric compounds.

Comparative Example 2

Manufacturing a Positive Photosensitive Resin Composition

The positive photosensitive resin composition is manufactured with the same method as Exemplary Embodiment 1, except for using the photosensitive component including 25 area percent of asymmetric compounds instead of 45 area percent of asymmetric compounds.

Comparative Example 3

Manufacturing a Positive Photosensitive Resin Composition

The positive photosensitive resin composition is manufactured with the same method as Exemplary Embodiment 1, except that the 3-(glycide oxypropyl)trimethoxysilane silane coupling agent is not used.

Comparative Example 4

Manufacturing a Positive Photosensitive Resin Composition

The positive photosensitive resin composition is manufactured with the same method as Exemplary Embodiment 1, except that 35 parts by weight of 3-(glycide oxypropyl)trimethoxysilane is used instead of 10 parts by weight of 3-(glycide oxypropyl)trimethoxysilane as the silane coupling agent.

Comparative Example 5

Manufacturing a Positive Photosensitive Resin Composition

The positive photosensitive resin composition is manufactured with the same method as Exemplary Embodiment 1, except that instead of using propylene glycol methyletheracetate and diethylene glycol methylethylether at 50 weight %:50 weight %, propylene glycol methyletheracetate and diethylene glycol methylethylether are used at 40 weight %:60 weight %.

Material properties of coating solutions of the positive photosensitive resin compositions manufactured in Exemplary Embodiments 1 to 13 and Comparative Examples 1 to 5 are measured with methods as described below, and results thereof are represented in Table 1.

a) VCD characteristic—after coating the positive photosensitive resin composition solutions manufactured in Exemplary Embodiments 1 to 13 and Comparative Examples 1 to 5 on 370 cm×470 cm glass substrates deposited with SiNx by using a slit coater, the glass substrates are prebaked on a hot plate for 2 minutes at 100° C. after performing VCD at 0.5 torr, thereby forming a 4.0 μm film. A case in which the VCD process time is less than 70 seconds is indicated by ○, a case of 70-80 seconds is indicated by Δ, and a case of more than 80 seconds is indicated by x.

b) Sensitivity—for the films obtained in a), a 12 μm×14 μm contact hole CD is formed, and ultraviolet rays having a broadband intensity of 25 mW/cm2 are irradiated through a light exposer at an interval of 1 second for 1-10 seconds by using a pattern mask having half tone transmittance of 75% for forming a pad portion. Next, developing is performed for 70 seconds at 23° C. by using a 2.38 weight % solution of tetramethyl ammonium hydroxide, and then cleansing is performed for 60 seconds using deionized (DI) water. For final hardening, heating is performed for 30 minutes at 230° C. with an oven such that a pattern film may be obtained. The sensitivity is measured based on an exposure amount of the 9.5 μm×12.5 μm contact hole CD is by using a SEM.

c) Limitation resolution—the limitation resolution is measured as a minimum size based on the contact hole of the pattern film formed when measuring the sensitivity of b). A case in which a CD ("Critical Dimension") bias is equal is represented by the limitation resolution.

d) Contact hole residue—residue (scum) is measured based on the contact hole of the pattern film formed when measuring the sensitivity of a). A case in which it is residue free is indicated by ○, and a case in which residue is detected is indicated by x.

e) Adherence—a case in which a minimum residue film of the pattern film of the pad formed when measuring the sensitivity of b) is less than 0.5 μm is indicated by ○, a case of 0.5-1.5 μm is indicated by Δ, and a case of more than 1.5 μm is indicated by x.

f) Transmittance—the transmittance is measured by integrating the transmittance of 400-800 nm of the pattern film formed when measuring the sensitivity in b) by using a spectrophotometer. At this time, a case in which the transmittance is more than 98% is indicated by ○, a case of 95-98% is indicated by Δ, and a case of less than 95% is indicated by x. A bare glass substrate is used when measuring the transmittance.

g) Redness—color coordinates are determined for the substrate when measuring the transmittance of f). A case in which the change rate of the color coordinates is red-shifted based on the bare glass by less than 5% is indicated by ○, a case of 5-10% is indicated by Δ, and a case of more than 10% is indicated by x.

h) Contrast ratio—when measuring the transmittance of e), the substrate is mounted between polarizers in a normally white mode by using a contrast tester (Model: CT-1), white luminance and black luminance are measured, and a ratio of white luminance to black luminance is measured as a contrast ratio. Here, a case in which the contrast ratio is more than 22,000 is indicated by ○, a case of between 20,000-22,000 is indicated by Δ, and a case of less than 20,000 is indicated by x.

TABLE 1

| | VCD characteristic | Sensitivity | Limitation resolution | Contact hole residue | Adherence | Transmittance | Redness | Contrast Ratio |
|---|---|---|---|---|---|---|---|---|
| EE1 | ○ | 140 | 5 | ○ | ○ | ○ | ○ | ○ |
| EE2 | ○ | 139 | 5 | ○ | ○ | ○ | ○ | ○ |
| EE3 | ○ | 138 | 5 | ○ | ○ | ○ | ○ | ○ |
| EE4 | ○ | 140 | 5 | ○ | ○ | ○ | ○ | ○ |
| EE5 | ○ | 140 | 5 | ○ | ○ | ○ | ○ | ○ |
| EE6 | ○ | 137 | 5 | ○ | ○ | ○ | ○ | ○ |
| EE7 | ○ | 138 | 5 | ○ | ○ | ○ | ○ | ○ |
| EE8 | ○ | 140 | 5 | ○ | ○ | ○ | ○ | ○ |
| EE9 | ○ | 136 | 5 | ○ | ○ | ○ | ○ | ○ |
| EE10 | ○ | 137 | 5 | ○ | ○ | ○ | ○ | ○ |
| EE11 | ○ | 138 | 5 | ○ | ○ | ○ | ○ | ○ |
| EE12 | ○ | 137 | 5 | ○ | ○ | ○ | ○ | ○ |

TABLE 1-continued

| | VCD characteristic | Sensitivity | Limitation resolution | Contact hole residue | Adherence | Transmittance | Redness | Contrast Ratio |
|---|---|---|---|---|---|---|---|---|
| EE13 | ○ | 140 | 5 | ○ | ○ | ○ | ○ | ○ |
| CE1 | ○ | 155 | 5 | ○ | X | X | X | X |
| CE2 | ○ | 160 | 6 | ○ | X | X | X | X |
| CE3 | ○ | 138 | 6 | ○ | X | X | X | X |
| CE4 | ○ | 155 | 6 | X | ○ | X | X | X |
| CE5 | X | 140 | 6 | ○ | ○ | ○ | ○ | ○ |

1. As used in Table 1, "EE" means Exemplary Embodiment and "CE" means Comparative Example.

Through Table 1, Exemplary Embodiments 1 to 13 of the positive photosensitive resin composition are shown to have excellent sensitivity, adherence, transmittance, redness, and contrast ratio compared with Comparative Examples 1 and 2, to have excellent adherence, transmittance, redness, and contrast ratio compared with Comparative Example 3, and to have excellent sensitivity, contact hole residue, transmittance, redness, and contrast ratio compared with Comparative Example 4. Also, it may be confirmed that they have an excellent VCD characteristic compared with Comparative Example 5.

Accordingly, the positive photosensitive resin composition according to an exemplary embodiment of the present invention has excellent performance such as with the VCD characteristic, the resolution, the contact hole residue, the transmittance, and the contrast ratio, and particularly there is very little red-shift and the sensitivity and the adherence are remarkably improved in a high temperature—high moisture environment, thereby obtaining a positive photosensitive resin composition that is suitable for forming an interlayer insulating layer of a display device.

Next, a display device including an organic layer and a method of forming an organic pattern by using the photosensitive resin composition according to an exemplary embodiment of the present disclosure will be described with reference to FIG. 1 and FIG. 2.

FIG. 1 is a top plan view of a display device according to an exemplary embodiment of the present invention. FIG. 2 is a cross-sectional view taken along the line II-II of FIG. 1.

Figure 2:
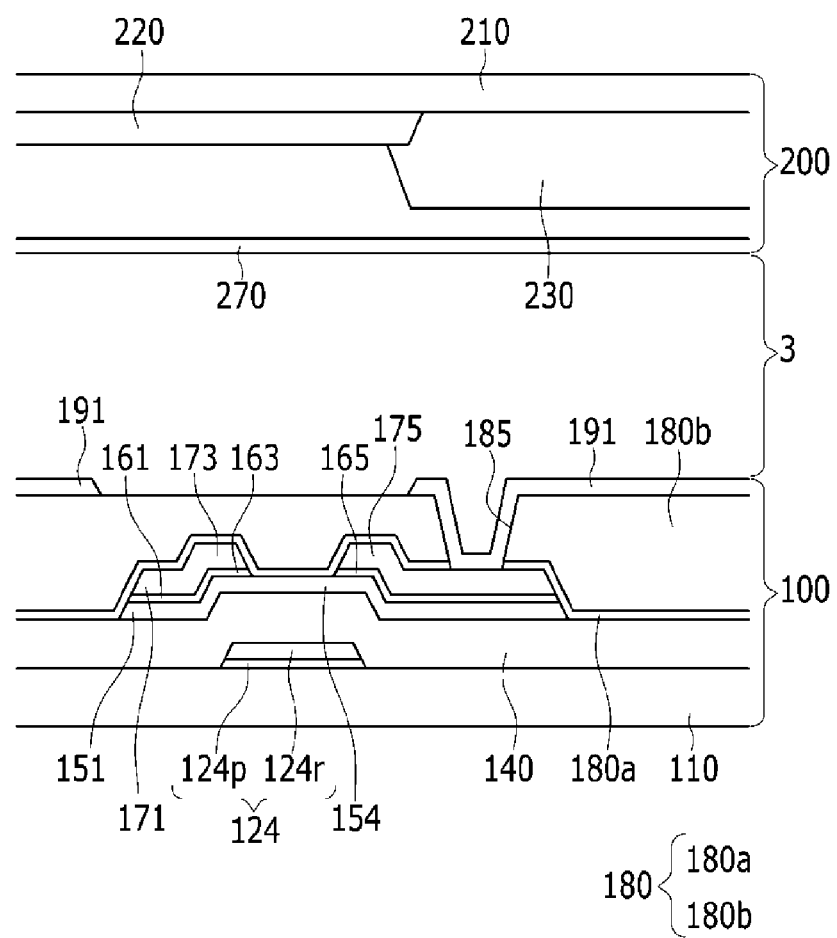
FIG. 2 is a cross-sectional view of the display device of FIG. 1 taken along line II-II.

Referring to FIG. 1 and FIG. 2, a display device according to the present exemplary embodiment includes a lower panel 100 and an upper panel 200, and a liquid crystal layer 3 interposed between the two display panels 100 and 200.

Firstly, the lower panel 100 will be described.

A plurality of gate lines 121 are formed on an insulation substrate 110 made of transparent glass or plastic.

The gate lines 121 transmit gate signals and extend in a transverse direction. Each gate line 121 include a plurality of gate electrodes 124 protruding from the gate line 121 and a wide end portion 129 for connection with another layer or a gate driver (not shown). The end portion 129 of the gate line may be formed of a dual-layered structure including a lower layer 129p and an upper layer 129r.

The gate line 121 and the gate electrode 124 have a dual-layered structure configured by lower layers 121p and 124p and upper layers 121r and 124r. The lower layers 121p and 124p may be made of one of titanium, tantalum, molybdenum, and alloys thereof, and the upper layers 121r and 124r may be made of copper (Cu) or a copper alloy. In the exemplary embodiment, the gate line 121 and the gate electrode 124 have the dual-layered structure, but may be formed in a single-layered structure.

A gate insulating layer 140 made of an insulating material such as silicon nitride is formed on the gate lines 121.

A semiconductor layer 151 made of hydrogenated amorphous silicon, polysilicon, or the like is formed on the gate insulating layer 140. The semiconductor 151 extends mainly in a longitudinal direction and includes a plurality of protrusions 154 extending toward the gate electrode 124.

A plurality of ohmic contact stripes 161 and ohmic contact islands 165 are formed on the projections 154 of the semiconductor layer 151. The ohmic contact stripes 161 have a plurality of projections 163, and the projections 163 and the ohmic contact islands 165 are disposed in pairs on the projections 154 of the semiconductor layer 151.

A plurality of data lines 171, a plurality of source electrodes 173 connected to the plurality of data lines 171, and a plurality of drain electrodes 175 facing the source electrodes 173 are formed on the ohmic contacts 161 and 165 and the gate insulating layer 140.

The data lines 171 transfer data signals and mainly extend in a vertical direction to cross the gate lines 121. The source electrode 173 may extend toward the gate electrode 124 to have a "U" shape, but this is just exemplary and it may have various modified shapes.

The drain electrode 175 is separated from the data line 171 and extended toward the upper portion from the center of the "U" shape of the source electrode 173. The data line 171 includes an end portion 179 having a wide area for connection with another layer or a data driver (not shown).

Although not shown, the data line 171, the source electrode 173, and the drain electrode 175 may have the dual-layer structure having the upper layer and the lower layer. The upper layers may be made of copper (Cu) or a copper alloy, and the lower layers may be made of one of titanium (Ti), tantalum (Ta), molybdenum (Mo), and alloys thereof.

The data line 171, the source electrode 173, and the drain electrode 175 may have tapered sides.

The ohmic contacts 161, 163, and 165 are disposed only between the semiconductors 151 and 154 disposed therebelow and the data line 171 and the drain electrode 175 disposed thereabove, and lower contact resistance therebetween. Further, the ohmic contacts 161, 163, and 165 have substantially the same planar pattern as the data line 171, the source electrode 173, and the drain electrode 175.

The projection 154 of the semiconductor layer 151 includes an exposed portion which is not covered by the data line 171 and the drain electrode 175 between the source electrode 173 and the drain electrode 175. The semiconductor layer 151 has substantially the same planar pattern as the ohmic contacts 161 and 165 except for the exposed portion of the projection 154.

One gate electrode 124, one source electrode 173, and one drain electrode 175 form one thin film transistor (TFT) together with the projection 154 of the semiconductor layer 151, and a channel of the thin film transistor is formed at the projection 154 between the source electrode 173 and the drain electrode 175.

A passivation layer 180 including a first passivation layer 180a and a second passivation layer 180b is formed on the data line 171, the drain electrode 175, and the projection 154 of the exposed semiconductor layer. The first passivation layer 180a may be formed of an inorganic insulator such as silicon nitride or silicon oxide, and the second passivation layer 180b may be formed of the photosensitive resin composition according to the above-described exemplary embodiment of the present disclosure. The first passivation layer 180a may be omitted.

The passivation layer 180 and the gate insulating layer 140 have a contact hole 181 exposing the end portion 129 of the gate line 121. Also, the passivation layer 180 has a contact hole 182 exposing the end portion 179 of the data line 171 and a contact hole 185 exposing one end of the drain electrode 175.

The second passivation layer 180b formed of the organic insulator may be patterned through an exposure and developing process. In detail, to form the second passivation layer 180b, the photosensitive resin composition according to the above-described exemplary embodiment is coated on the substrate 110 or the first passivation layer 180a by spin coating, slit and spin coating, slit coating, or roll coating, and a solvent is removed through prebaking thereby forming a coating layer. At this time, it is preferable that the prebaking is performed at a temperature of about 100 degrees to about 120 degrees for 1 to 3 minutes.

Next, visible rays, ultraviolet rays, circular ultraviolet rays, an electron beam, or X-rays are irradiated to formed coated layer according to a predetermined pattern, and the coated layer is developed by a developer to remove an unnecessary portion to form a predetermined pattern.

Here, it is preferable that the developer is an aqueous alkaline solution, and in detail, may be sodium hydroxide, potassium hydroxide, an inorganic alkali such as sodium carbonate, an ethyl amine, a primary amine such as n-propylamine and diethyl amine, a secondary amine such as n-propylamine, trimethyl amine, methyldiethyl amine, and dimethylethyl amine, a tertiary amine such as triethyl amine, dimethylethanol amine, and methyldiethanol amine, an alcohol amine such as triethanol amine, tetramethylammonium hydroxide, or a quaternary ammonium solution such as tetraethylammonium hydroxide. The primary amine may be an organic compound in which only one hydrogen atom of ammonia is substituted with a hydrocarbon group, and the secondary amine may be a structure in which two hydrogen atoms of ammonia are substituted with hydrocarbon groups.

At this time, the developer is made by dissolving the alkali compound to a 0.1 to 10 weight % concentration, and a soluble organic solvent such as methanol and ethanol and the surfactant may be added in an appropriate amount.

Also, after the developing using the above developer, cleansing using ultrapure water is performed for 30 seconds to 90 seconds to remove the unnecessary portion and drying is performed to form the pattern, and after the light such as ultraviolet rays is irradiated to the formed pattern, the pattern is heat-treated for 30 to 90 minutes at a temperature of 150 degrees to 400 degrees with a heating device such as an oven.

A pixel electrode 191 and contact assistants 81 and 82 are formed on the passivation layer 180. They may be made of a transparent conductive material such as ITO or IZO, or a reflective metal such as aluminum, silver, chromium, or alloys thereof.

The pixel electrode 191 is physically and electrically connected to the drain electrode 175 through the contact hole 185, and receives a data voltage from the drain electrode 175.

The contact assistants 81 and 82 are connected to the end portions 129 of the gate lines 121 and the end portions 179 of the data lines 171 through the contact holes 181 and 182, respectively. The contact assistants 81 and 82 compensate adhesiveness between the end portions 129 of the gate lines 121 and the end portions 179 of the data lines 171 and an external apparatus, and also protect them.

Next, the upper panel 200 will be described.

A light blocking member 220 is formed on an insulation substrate 210 made of transparent glass or plastic. The light blocking member 220 prevents light leakage between the pixel electrodes 191 and defines an opening region facing the pixel electrodes 191.

A plurality of color filters 230 are formed on the substrate 210 and the light blocking member 220. Most of the color filters 230 are formed in a region enclosed by the light blocking member 220, and may extend according to a column of the pixel electrodes 191. Each color filter 230 may display one of three primary colors such as red, green, and blue.

In the present exemplary embodiment, the light blocking member 220 and the color filter 230 are formed in the lower panel 200, however at least one of the light blocking member 200 and the color filter 230 may be formed in the upper panel 100.

An overcoat 250 (not shown) is formed on the color filter 230 and the light blocking member 220. The overcoat 250 may be made of an (organic) insulator, prevents the color filter 230 from being exposed, and provides a flat surface. The overcoat 250 may be omitted.

A common electrode 270 is formed on the overcoat 250. The common electrode 270 is preferably made of a transparent conductive material such as ITO and IZO, and receives a common voltage Vcom.

The liquid crystal layer 3 between the lower panel 100 and the upper panel 200 has negative dielectric anisotropy, and may be oriented such that the major axes of liquid crystal molecules of the liquid crystal layer 3 are almost perpendicular to the surfaces of the two display panels 100 and 200 when no electric field is applied.

The pixel electrode 191 and the common electrode 270 form a liquid crystal capacitor along with the liquid crystal layer 3 therebetween to maintain applied voltages after the thin film transistor is turned off.

The pixel electrode 191 may form a storage capacitor by overlapping a storage electrode line (not shown), and accordingly improve a voltage maintenance capability of a liquid crystal capacitor.

The exemplary embodiment in which the photosensitive film resin composition according to an exemplary embodiment of the present disclosure is used as the organic insulator of the liquid crystal display is provided, however the photosensitive film resin composition according to the present exemplary embodiment may be applied to all display devices using the organic insulator such as an organic light emitting device.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A photosensitive resin composition comprising:
an acrylic copolymer comprising a polymerization product of
  a first monomer comprising at least one selected from an unsaturated carboxylic acid and an unsaturated carboxylic acid anhydride, and
  a second monomer comprising an olefin-based unsaturated compound;
a photosensitive component comprising at least one 1,2-quinonediazide-5-sulfonic acid ester compound selected form compounds represented by Chemical Formulas 1 to 4:

Chemical Formula 1

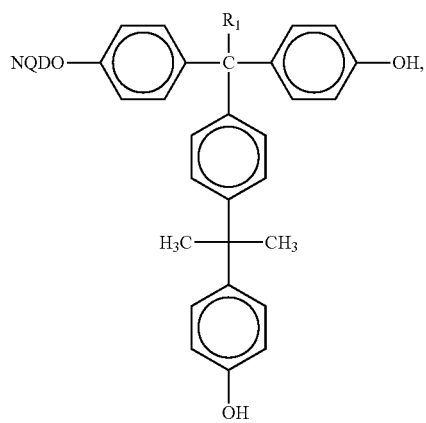

Chemical Formula 2

Chemical Formula 3

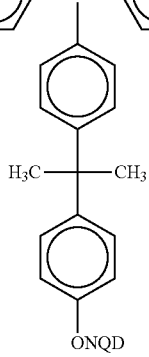

Chemical Formula 4

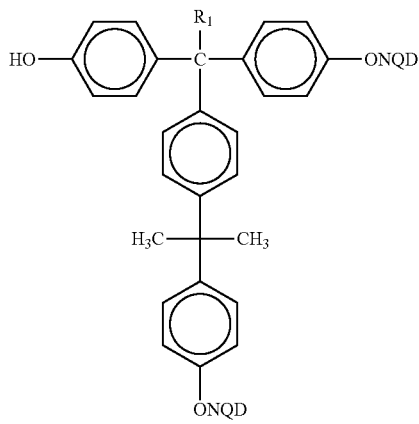

wherein $R_1$ is a hydroxyl group or a methyl group, and NQD is a 1,2-quinonediazide 5-sulfonyl group;
a coupling agent; and
a solvent,
wherein a total amount of asymmetric compounds in the photosensitive component is greater than or equal to 45 area percent as determined by high performance liquid chromatography.

2. The photosensitive resin composition of claim 1, wherein
the photosensitive component further comprises at least one compound selected from compounds represented by Chemical Formulas 5 to 7:

Chemical Formula 5

Chemical Formula 6

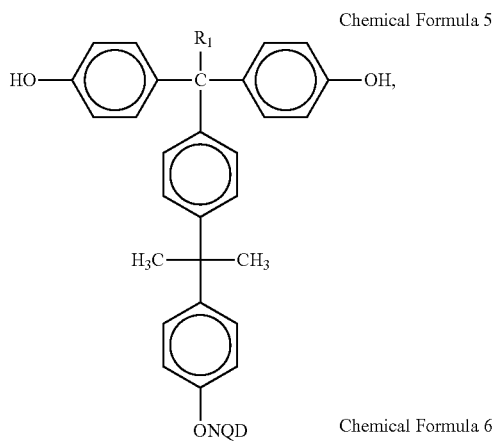

Chemical Formula 7

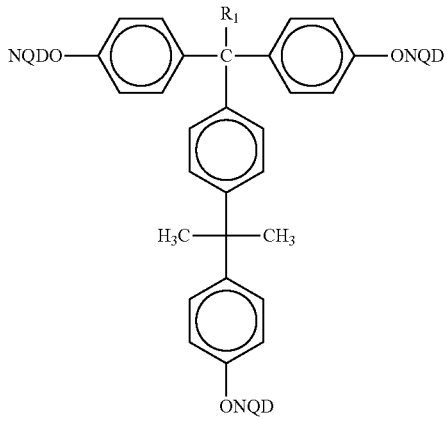

wherein $R_1$ is a hydroxyl group or a methyl group, and NQD is a 1,2-quinonediazide 5-sulfonyl group.

3. The photosensitive resin composition of claim 1, wherein
the coupling agent comprises a silane coupling agent.

4. The photosensitive resin composition of claim 3, wherein:
the photosensitive component is present in an amount of about 5 parts by weight to about 50 parts by weight, and the silane coupling agent is present in an amount of about 0.1 parts by weight to about 30 parts by weight, each based on 100 parts by weight of the acrylic copolymer.

5. The photosensitive resin composition of claim 4, wherein the acrylic copolymer is a polymerization product of
about 5 parts by weight to about 40 part by weight of the first monomer, and
about 60 parts by weight to about 95 parts by weight of the second monomer, each based on a total part by weight of the first monomer and the second monomer.

6. The photosensitive resin composition of claim 5, wherein
the solvent comprises a first solvent having a boiling point of about 110° C. to about 150° C. and an evaporation speed of about 0.3 to about 1.0 relative to normal butyl acetate.

7. The photosensitive resin composition of claim 6, wherein
the first solvent is present in an amount of more than 50 weight percent, based on the total weight of the solvent.

8. The photosensitive resin composition of claim 1, wherein
the unsaturated carboxylic acid and the unsaturated carboxylic acid anhydride comprises at least one selected from acrylic acid, methacrylic acid, maleic acid, fumaric acid, citraconic acid, metaconic acid, itaconic acid, and anhydrides thereof.

9. The photosensitive resin composition of claim 1, wherein
the olefin-based unsaturated compound comprises at least one selected from methylmethacrylate, ethylmethacrylate, n-butyl methacrylate, sec-butyl methacrylate, tert-butyl methacrylate, methylacrylate, isopropyl acrylate, cyclohexyl methacrylate, 2-methylcyclo hexylmethacrylate, dicyclopentenylacrylate, dicyclopentanylacrylate, dicyclopentenylmethacrylate, dicyclopentanylmethacrylate, 1-adamantyl acrylate, 1-adamantyl methacrylate, dicyclopentanyloxyethylmethacrylate, isoboronylmethacrylate, cyclohexylacrylate, 2-methylcyclohexylacrylate, dicyclopentanyloxyethylacrylate, isoboronylacrylate, penylmethacrylate, penylacrylate, benzylacrylate, 2-hydroxyethylmethacrylate, styrene, σ-methyl styrene, m-methyl styrene, p-methyl styrene, vinyltoluene, p-methoxy styrene, 1,3-butadiene, isoprene, 2,3-dimethyl 1,3-butadiene, acrylic acid glycidyl ester, methacrylic acid glycidyl ester, α-ethylacrylic acid glycidyl ester, α-n-propylacrylic acid glycidyl ester, α-n-butylacrylic acid glycidyl ester, acrylic acid-β-methylglycidyl ester, methacrylic acid-β-methylglycidyl ester, acrylic acid-β-ethylglycidyl ester, methacrylic acid-β-ethylglycidyl ester, acrylic acid-3,4-epoxybutyl ester, methacrylic acid-3,4-epoxybutyl ester, acrylic acid-6,7-epoxyheptyl ester, methacrylic acid-6,7-epoxyheptyl ester, α-ethylacrylic acid-6,7-epoxyheptyl ester, o-vinylbenzylglycidylether, m-vinylbenzylglycidylether, p-vinylbenzylglycidylether, and methacrylic acid 3,4-epoxy cyclohexyl ester.

10. The photosensitive resin composition of claim 1, wherein
the acrylic copolymer has a polystyrene exchange weight average molecular weight of about 3000 Daltons to about 30,000 Daltons.

11. The photosensitive resin composition of claim 1, wherein
the coupling agent comprises at least one selected from (3-glycide oxypropyl)trimethoxysilane, (3-glycide oxypropyl)triethoxysilane, (3-glycide oxypropyl)methyldimethoxysilane, (3-glycide oxypropyl)methyldiethoxysilane, (3-glycide oxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysily-N-(1,3-dimethyl-butylidene)propylamine, N-2(aminoethyl)3-aminopropyltrimethoxysilane, N-2(aminoethyl)3-aminopropyltriethoxysilane, N-2(aminoethyl)3-aminopropylmethyldimethoxysilane, N-phenyl-3-aminopropyltrimethoxysilane, and (3-isocynateprophyl)triethoxysilane.

12. A method of forming a pattern, the method comprising
disposing a photosensitive resin composition on a substrate,
exposing the photosensitive resin composition, and
developing the photosensitive resin composition,
wherein the photosensitive resin composition comprises:
an acrylic copolymer comprising a polymerization product of
a first monomer comprising at least one selected from an unsaturated carboxylic acid and an unsaturated carboxylic acid anhydride, and
a second monomer comprising an olefin-based unsaturated compound;
a photosensitive component comprising at least one 1,2-quinonediazide-5-sulfonic acid ester compound selected from compounds represented by Chemical Formulas 1 to 4:

Chemical Formula 1
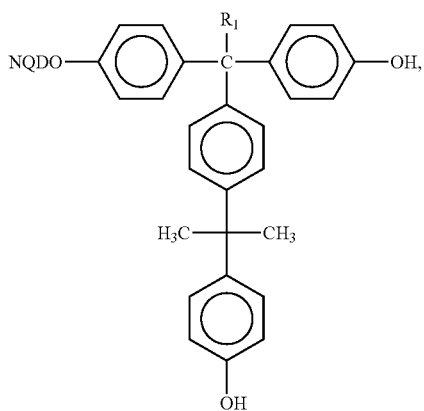

Chemical Formula 2
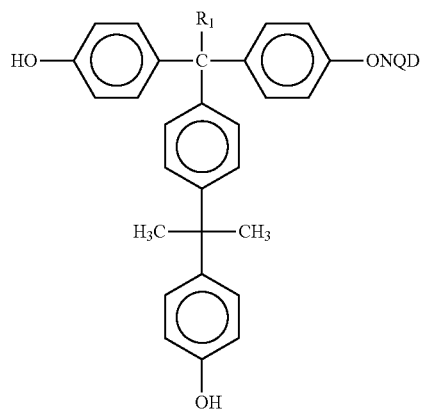

Chemical Formula 3
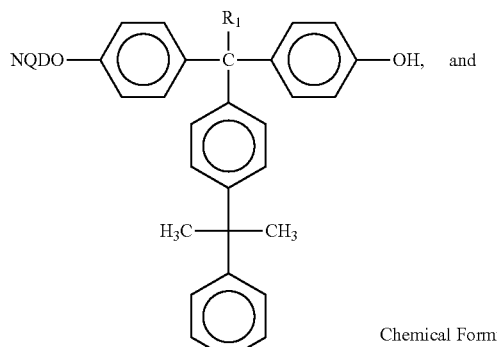

Chemical Formula 4
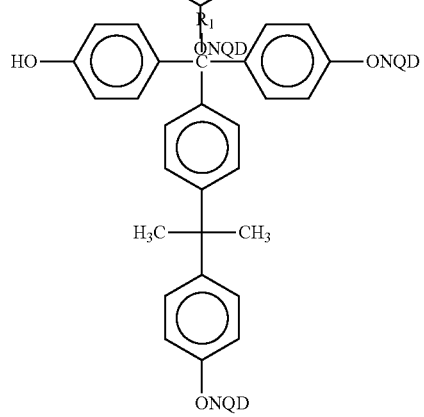

wherein $R_1$ is a hydroxyl group or a methyl group, and NQD is a 1,2-quinonediazide 5-sulfonyl group;
a coupling agent; and
a solvent,
wherein a total amount of asymmetric compounds in the photosensitive component is greater than or equal to 45 area percent as determined by high performance liquid chromatography.

13. The method of claim 12, wherein
the photosensitive component further comprises at least one compound selected from compounds represented by Chemical Formulas 5 to 7:

Chemical Formula 5
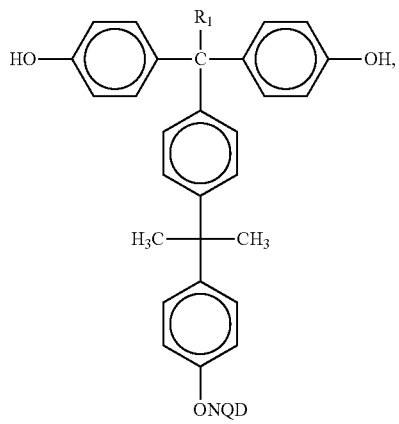

Chemical Formula 6
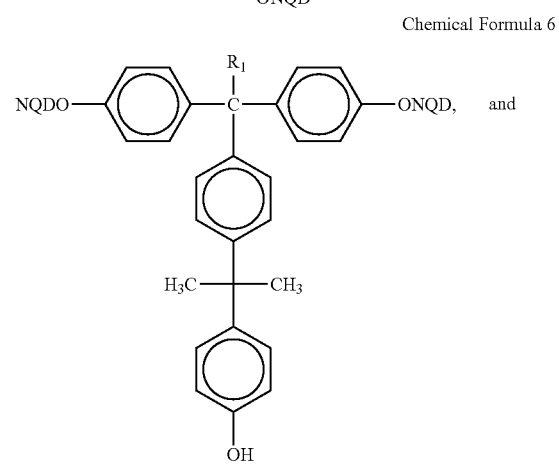

Chemical Formula 7
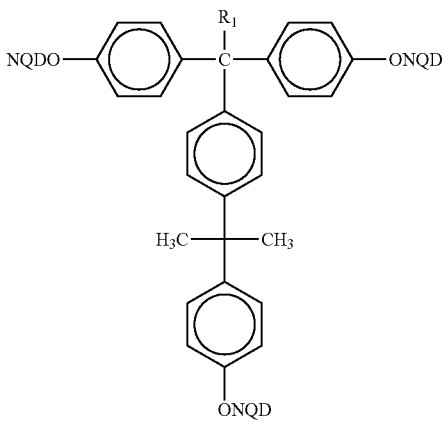

wherein R₁ is a hydroxyl group or a methyl group, and NQD is a 1,2-quinonediazide 5-sulfonyl group.

14. The method of claim 12, wherein
the coupling agent comprises a silane coupling agent.

15. The method of claim 14, wherein:
the photosensitive component is present in an amount of about 5 parts by weight to about 50 parts by weight, and the silane coupling agent is present in an amount of about 0.1 parts by weight to about 30 parts by weight, each based on 100 parts by weight of the acrylic copolymer.

16. The method of claim 15, wherein the acrylic copolymer comprises a polymerization product of about 5 parts by weight to about 40 part of weight of the first monomer and about 60 parts by weight to about 95 parts by weight of the second monomer, each based on a total part by weight of the first monomer and the second monomer.

17. The method of claim 16, wherein
the solvent comprises a first solvent having a boiling point of about 110° C. to about 150° C. and an evaporation speed of about 0.3 to about 1.0 relative to normal butyl acetate.

18. The method of claim 12, wherein
the coupling agent comprises at least one selected from (3-glycide oxypropyl)trimethoxysilane, (3-glycide oxypropyl)triethoxysilane, (3-glycide oxypropyl)methyldimethoxysilane, (3-glycide oxypropyl)methyldiethoxysilane, (3-glycide oxypropyl)dimethylethoxysilane, 3,4-epoxybutyltrimethoxysilane, 3,4-epoxybutyltriethoxysilane, 2-(3,4-epoxycyclohexyl) ethyltrimethoxysilane, 2-(3,4-epoxycyclohexyl) ethyltriethoxysilane, aminopropyltrimethoxysilane, aminopropyltriethoxysilane, 3-triethoxysily-N-(1,3 dimethyl-butylidene)propylamine, N-2(aminoethyl)3-aminopropyltrimethoxysilane, N-2(aminoethyl)3-aminopropyltriethoxysilane, N-2(aminoethyl)3-aminopropylmethyldimethoxysilane, N-phenyl-3-aminopropyltrimethoxysilane, and (3-isocynateprophyl)triethoxysilane.

19. The method of claim 12, further comprising
prebaking the photosensitive composition at a temperature of about 100 degrees Celsius to about 120 degrees Celsius before the exposing.

20. The method of claim 12, wherein
the developing comprises using a developer comprising an alkali solution.

\* \* \* \* \*